US005908699A

United States Patent [19]

Kim

[11] Patent Number: 5,908,699

[45] Date of Patent: Jun. 1, 1999

[54] COLD CATHODE ELECTRON EMITTER AND DISPLAY STRUCTURE

[75] Inventor: Seong I. Kim, Northvale, N.J.

[73] Assignee: Skion Corporation, Hoboken, N.J.

[21] Appl. No.: 08/857,295

[22] Filed: May 16, 1997

Related U.S. Application Data

[63] Continuation-in-part of application No. 08/731,349, Oct. 11, 1996, Pat. No. 5,852,303.

[51] Int. Cl.[6] .......... H01L 29/06

[52] U.S. Cl. .......... 428/408; 257/9; 257/10; 257/11; 257/77; 313/310; 313/311; 313/326; 313/345; 313/346 R; 313/346 DC; 313/355; 315/169.3; 427/126.1; 427/126.3; 427/523; 427/529; 427/530; 427/577; 427/585; 428/697; 428/699; 428/701; 428/702

[58] Field of Search .......... 428/408, 697, 428/699, 701, 702; 427/126.1, 126.3, 523, 529, 530, 575, 585; 315/169.3; 313/310, 311, 326, 345, 346 R, 346 DC, 355; 257/9, 10, 11, 77

[56] References Cited

U.S. PATENT DOCUMENTS

| | | | |
|---|---|---|---|
| 3,631,303 | 12/1971 | Antypas et al. | 257/10 |
| 3,706,920 | 12/1972 | Caldwell et al. | 317/234 R |
| 3,814,993 | 6/1974 | Kennedy | 357/30 |
| 3,858,955 | 1/1975 | Sommer | 257/10 |
| 3,872,489 | 3/1975 | Hagenlocher | 257/11 |
| 4,747,998 | 5/1988 | Barrus et al. | 376/336 |
| 5,410,166 | 4/1995 | Kennel | 257/77 |
| 5,463,271 | 10/1995 | Geis et al. | 313/346 R |
| 5,578,886 | 11/1996 | Holmlid et al. | 310/306 |
| 5,696,385 | 12/1997 | Song et al. | 257/10 |
| 5,729,094 | 3/1998 | Geis et al. | 315/169.1 |

OTHER PUBLICATIONS

Dance, B., "Europe's FPD Development Offers Chance to Compete", Semiconductor Int'l, Jul. 1995, pp. 229–232.

Kumar et al., "Diamond–based field emission flat panel displays", Solid State Technology, May 1995, pp. 71–74.

Spindt et al., "Physical properties of thin–film field emission cathodes with molybdenum cones", J. App., Phys.,v 47, 12, Dec. 1976, pp. 5248–5263.

*Primary Examiner*—Archene Turner

*Attorney, Agent, or Firm*—Ohlandt, Greeley, Ruggiero & Perle

[57] ABSTRACT

A cold cathode electron emission structure includes an amorphous carbon matrix having cesium dispersed therein, with the cesium present in substantially non-crystalline form. A cesium-carbon-oxide layer is positioned on the amorphous carbon matrix, constitutes an electron emission surface and causes the cold cathode electron emission structure to exhibit a lowered surface work function. A display structure including the aforedescribed cold cathode electron emission structure further includes a target electrode including a phosphor and exhibiting a target potential for attraction of electrons. A gate electrode is positioned between the electron emission structure and the target electrode and is biased at a gate potential which attracts electrons, but which is insufficient, in combination with the target potential, to cause emission of a beam of electrons from the electron emission structure. A control electrode is coupled to the electron emission structure and selectively applies a low-voltage control potential which, in combination with the gate potential and the target voltage, is sufficient to cause the electron emission structure to emit a beam of electrons towards the target electrode. The cesium-carbon-oxide layer in combination with the control electrode further enables the achievement of a long focal length, field effect display structure.

12 Claims, 5 Drawing Sheets

COLD CATHODE ELECTRON EMITTER AND DISPLAY STRUCTURE

This Application is a continuation-in-part of U.S. patent application Ser. No. 08/731,349, filed Oct. 11, 1996 , now U.S. Pat. No. 5,852,303 and entitled "Thin Film Amorphous Matrices having Dispersed Cesium and Method of Making".

FIELD OF THE INVENTION

This invention relates to cold cathode electron emitters and, more particularly, to an improved cold cathode electron emitter which exhibits a low surface work function and a display structure employing the improved cold cathode electron emitter.

BACKGROUND OF THE INVENTION

Cold cathode electron emitters are known in the prior art and generally comprise an electron emission structure that is spaced apart from a target. A potential is applied between the electron emission structure and the target which is sufficient to cause electron migration from the electron emission structure to the target. Successful cold cathode electron emitters are required to exhibit a low surface work function so as to avoid the necessity of excessively high applied voltages. Surface work function is the energy required to remove electrons from the surface of a material. Hot cathode electron emitters overcome an electron emission structure's surface work function by applying high levels of heat to provide the energy required to stimulate the electron emission.

In general, an electron emission structure is configured with a sharp tip so that the electric field present thereat is highly intense and thus able to overcome the emitter's surface work function. The electric field at a sharp tip is inversely proportional to the radius of the tip, thus a small applied voltage and a very small radius tip (approximately 1–10 manometers) provides a very strong electric field which enables the emission of electrons by the field emission mechanism.

Cold cathode electron emitters have been fabricated using thin-film techniques. Spindt et al. in "Physical Properties of Thin-film Field Emission Cathodes with Molybdenum Cones", Journal of Applied Physics, Volume 47, No. 12, December 1976, pages 5248–5263, describe a field emission cathode which utilizes a molybdenum emitter. Spindt et al. produce such emitters, using micro-lithography techniques, in arrays of molybdenum cones and have demonstrated the availability of currents in the range of 50–150 microamperes per cone.

Kumar et al. in "Diamond-based Field Emission Flat Panel Displays", Solid State Technology, May 1995, pages 71–74, describe a display structure which employs a cold cathode electron emitter. The emission substrate is a dense, nano-crystalline carbon film, with a large percentage of the available carbon exhibiting $sp^3$ "diamond"-bonded carbon while the remaining material is in the form of $sp^2$ graphitic carbon. Further details of other field emission displays can be found in "Europe's FPD Development Offers a Chance to Compete", Dance, B., Semiconductor International, July 1995, pages 229–232.

One of the major technical obstacles to the commercialization of field emission displays involves the reliability of the cold cathode electron emission arrays. The lack of reliability originates from the high fields required for emission at room temperature. Over time, these fields (through sputtering or sputtering contamination) damage the sharp emitter tips and thus decrease their electron emission efficiency. For this reason diamond-coated tips have been proposed as cold cathode electron emission structures because diamond, simultaneously provides both mechanical strength and relatively low field operation. Prototypes employing such diamond emitters, however, still suffer from high turn-on voltages, high cost and short working life.

A common feature of many prior art field emission displays is a requirement to switch relatively large voltages on a plurality of address lines. Such switching actions create large voltage excursions which causes noise and other interference affects during the operation of the display. Nevertheless, it has been thought to be a requirement to switch such high voltages, to achieve selective electron emission from the cold cathode emission sources.

Accordingly, it is an object of this invention to provide an improved cold cathode electron emission source which exhibits a lowered surface work function.

It is another object of this invention to provide a method for the manufacture of an improved cold cathode electron emission source which exhibits a lowered surface work function.

It is still another object of this invention to provide an improved cold cathode electron emission source which exhibits an improved electron beam pattern.

It is yet another object of this invention to provide a cold cathode electron emission structure which avoids the need for switching high voltages to achieve display cell activation.

SUMMARY OF THE INVENTION

A cold cathode electron emission structure includes an amorphous carbon matrix having cesium dispersed therein, with the cesium present in substantially non-crystalline form. A cesium-carbon-oxide layer is positioned on the amorphous carbon matrix, constitutes an electron emission surface and causes the cold cathode electron emission structure to exhibit a lowered surface work function. A display structure including the aforedescribed cold cathode electron emission structure further includes a target electrode including a phosphor and exhibiting a target potential for attraction of electrons. A gate electrode is positioned between the electron emission structure and the target electrode and is biased at a gate potential which attracts electrons, but which is insufficient, in combination with the target potential, to cause emission of a beam of electrons from the electron emission structure. A control electrode is coupled to the electron emission structure and selectively applies a low-voltage control potential which, in combination with the gate potential and the target voltage, is sufficient to cause the electron emission structure to emit a beam of electrons towards the target electrode. The cesium-carbon-oxide layer in combination with the control electrode further enables the achievement of a long focal length, field effect display structure.

BRIEF DESCRIPTION OF THE DRAWINGS

FIG. 2(*a*) illustrates the experimental setup used to measure work function.

FIG. 2(*b*) is a plot of (normalized photosignal)$^{1/2}$ versus work function for a sample photoemission measurement.

DETAILED DESCRIPTION OF THE INVENTION

Prior to describing the details of the invention, a brief resume of the electron emission structure and method disclosed in co-pending U.S. patent application Ser. No. 08/731,349 will be provided. The disclosure thereof is incorporated herein by reference. The electron emission structure described in the aforementioned application comprises an amorphous matrix of a base material, such as carbon, into which cesium has been dispersed. The matrix is formed on a substrate of the type commonly used in thin film depositions, such as molybdenum, silicon, glass, titanium dioxide, etc. The preferred carbon amorphous matrix exhibits a high $sp^3/sp^2$ bond ratio. The cesium, preferably in ion form, is dispersed throughout the amorphous matrix. The carbon base material is largely in tetrahedrally bonded ($sp^3$) form. The cesium, rather than occupying the place of carbon in the matrix, is found between the matrix interstices.

The amorphous matrix can include dopants to increase the conductivity of the material. The combination of the cesium, dopant and carbon matrix make the resulting material amenable as a cold cathode electron emitter. Either N- or P-type dopants can be used and may be added by either co-implantation or a subsequent implantation after the formation of the amorphous matrix.

When the high $sp^3$ ratio amorphous diamond matrix is grown with cesium incorporated therein, the matrix becomes conductive. The incorporation of the cesium and (cesium compounds) into the bulk of the matrix reduces the matrix work function for electron emission. Electron emitting structures produced in accordance with the described process (and as further described in co-pending application Ser. No. 08/731,349) have evidenced a work function as low as 1.1 eV.

It has newly been determined that creation of an cesium-carbon-oxide surface on the amorphous matrix of carbon and cesium described above enables a lowering of the work function from 1.1 eV to 1.05 eV. Further, it has been determined that the work function characteristic of the resulting structure is stable up to 750° C. As is known, the lower the work function of an electron emission material, the lower the applied voltage that is required to enable the emission action to occur. This fact lessens the required applied voltage and reduces any sputtering effects that may be present.

Figure 1:
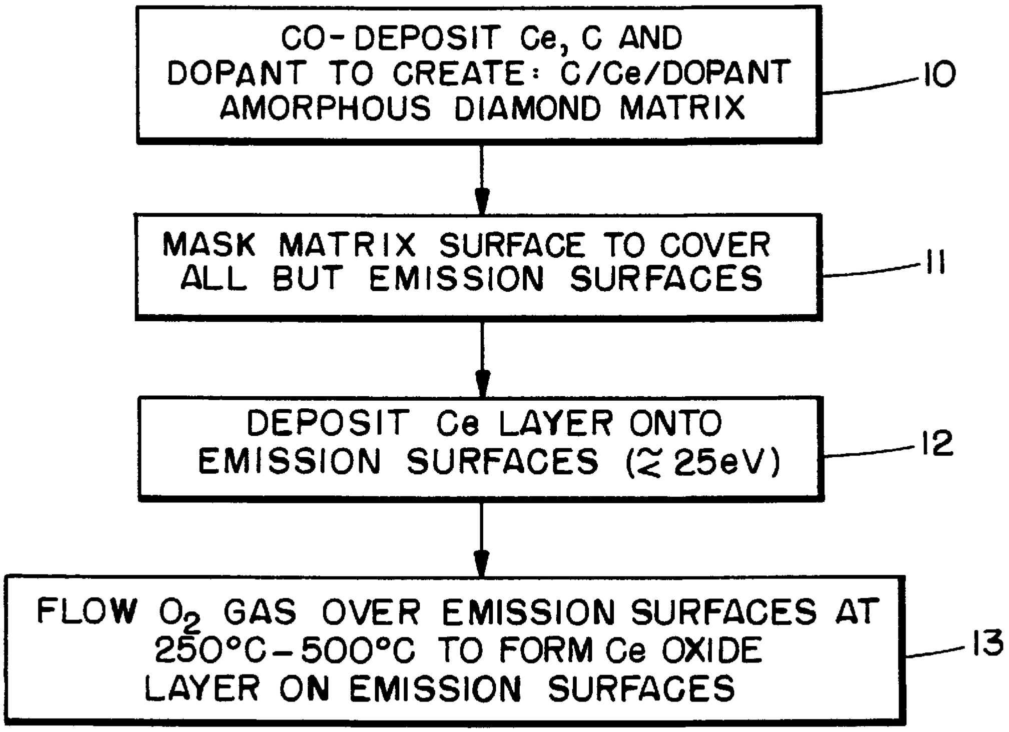
FIG. 1 is flow diagram illustrating the process used to create a cold cathode electron emission structure in accordance with the invention hereof.

Turning to FIG. 1, the process initially commences with a co-deposition (preferably) of cesium, a dopant and carbon to create an amorphous diamond matrix with cesium and dopant inclusions (box 10). Thereafter, the surface of the matrix, except that which is to serve as an electron emission region, is masked (box 11). Next, a cesium layer is deposited onto the emission surface with a deposition energy level of about 25 eV or less. Such deposition may be accomplished through use of a cesium ion beam or a cesium vapor (box 12). The deposited cesium layer is very thin (approximately 5 atomic layers) and serves to enable the creation of a subsequent cesium-carbon-oxide on (and into) the amorphous carbon/cesium matrix. Without the presence of the cesium layer, the chemical inertness of the carbon $sp^3$ rich bonding does not allow the formation of an oxide overlayer.

After deposition of the cesium layer, oxygen gas is flowed over the emitting surface at a temperature in the range of 250° C.–500° C. (box 13). This action enables the formation of a cesium-carbon-oxide layer, both on and into the emission surface. The cesium layer enhances the oxidation process and enables an oxide formation which extends into the uppermost surface layers of the emitting surface.

It has been determined that a relatively high cesium content source (i,e,. a cesium neutral flux greater than $10^{13}$ Atoms/cm$^2$ sec) is necessary for the formation of a stable surface oxide layer. Films made with lower cesium flux levels (less than $10^{12}$ Atoms/centimeter$^2$ sec) did not form an oxide overlayer due to the chemical inertness of the $sp^3$ rich bonding.

Figure 2A:
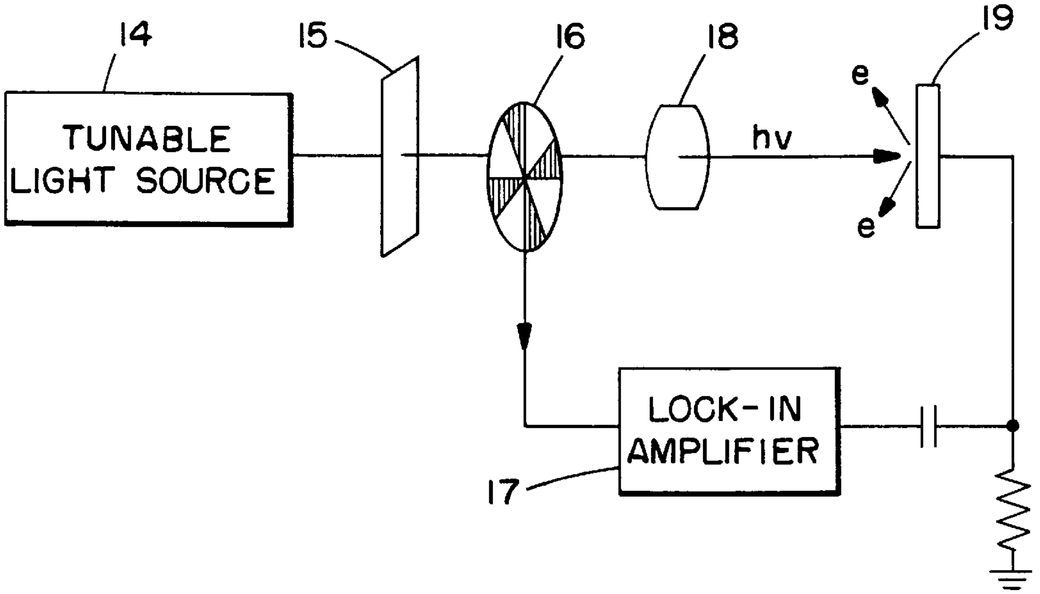
FIG. 2 is a plot of surface work function versus post-annealing temperature for plural different films: (a) Cs on Si<100>, (b) CsC on Si<100>, and (c) oxygen treated CsC on Si<100>.
Figure 2:
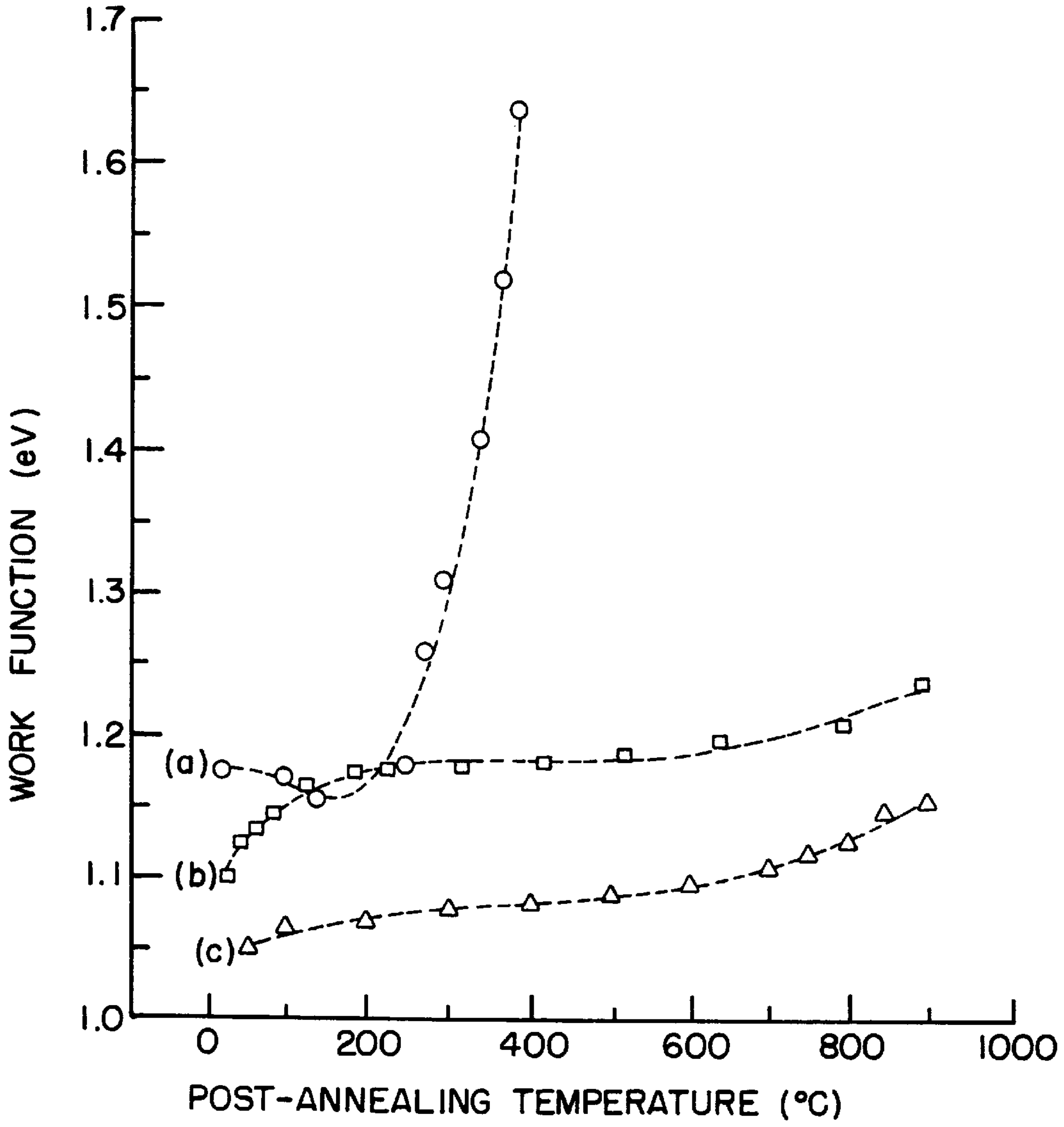

Referring to FIG. 2, a plot of work function versus post-annealing temperature is plotted for different films. The work function is measured after annealing and at each data point temperature. Plot (a) shows that a cesium on silicon<100> substrate commences with a work function of approximately 1.8 eV which then increases exponentially in a post-anneal temperature range of 200–250° C. This is due to evaporation of cesium (as it is not stably incorporated in the film). Plot (b) shows the change in work function of an amorphous matrix including cesium which has been deposited on a silicon substrate. With no anneal action, a work function of 1.1 eV is present which increases as the anneal temperature rises to 200°, eventually reaching approximately 1.2 after a 750° C. anneal. Plot (c) shows change in work function for an amorphous matrix of carbon with cesium, which has been subjected to the above-indicated oxidation treatment (where the substrate is silicon<100>. A work function of approximately 1.05 eV was determined. The cesium content of the amorphous film, made in accordance with the invention, was highly stable even after a 750° C. anneal. It is believed that the cesium stability results from the capping effect of the oxide overlayer. Thus, the oxidation treated surface shows high thermal stability, which establishes a capacity to withstand further post-deposition processing (e.g., a vacuum bake-out and sealing).

Figure 2B:
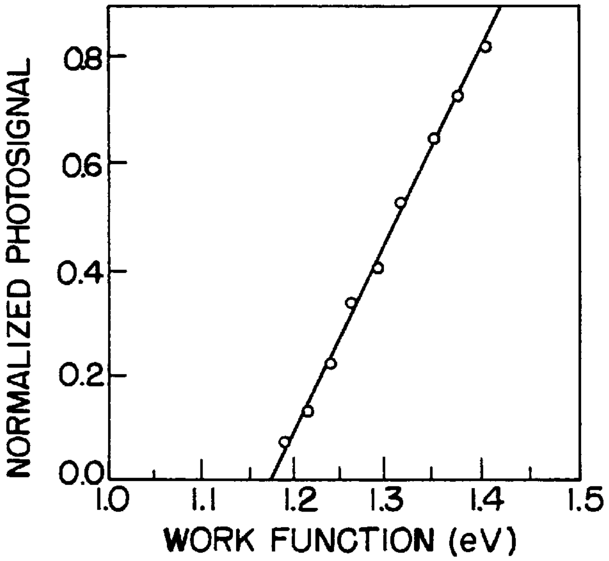

FIG. 2*a* illustrates the experimental arrangement for the measurements of work function that are plotted in FIG. 2. A tunable, monochromatic light source 14 was used and its wavelength output was precisely controlled using two gratings (not shown), one at 1200 lines/mm and another at 600 lines/mm. The 1200 lines/mm grating was used for the shorter wavelengths (250–850 nm) calibration and the 600 lines/mm grating was used for the longer wavelengths (850–1200 nm). A long wavelength-pass filter 15 was also used to eliminate second order dispersion of the gratings. A chopper 16, operating at 400–500 Hz, interrupted the light beam and further provided a reference signal to a lock-in amplifier 17. The interrupted beam was focused by lens 18 onto a target device 19. The photosignal from target device 19 was monitored by lock-in amplifier 17 by varying the wavelength of the incident light until the photosignal value was close to the background noise. The background noise from the obtained raw data was subtracted to obtain the pure photosignal. The resulting signals at different wavelengths were normalized by dividing by the spectral density value of the light source. The square root of the normalized photosignal was plotted versus photon energy as a least squares fit to a straight line. A plot of the straight line is shown in FIG. 2*b* and is a sample photo emission measurement which indicates that the work function can be estimated by reading an intercept value on the photon energy axis.

The measurements were obtained as follows. The surface of the target device was cleaned by cesium ion sputtering, annealed and then exposed to a dose of 25 eV cesium ions at room temperature. The target device was then moved to the work function station and the work function was measured. All work function measurements were taken after cooling of the target device to room temperature. The cesium dose was measured by integrating the current to the target device (i.e., a silicon substrate).

While there are many applications for cold cathode electron emission sources, one of the more widely used applications is in the field of flat panel displays. As is known, such displays employ orthogonal matrices of electrodes, with cold cathode emission structures positioned at the electrode intersections. Further, each emission site includes a gate structure positioned between the cold cathode emitter and an anode electrode which includes a phosphor. Because gate voltages on the order of 50–80 volts have been required to be switched in order to achieve picture element selection, substantial voltage transients are present during the operation of such a display panel. Such transients not only produce both inter-electrode noise and but also radiation effects.

Figure 3:
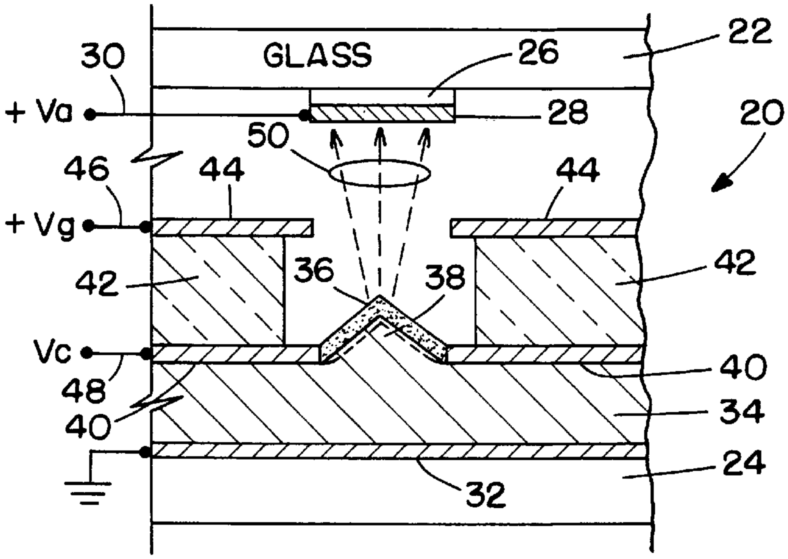
FIG. 3 is a sectional view of a cold cathode electron emission structure/display apparatus incorporating the invention.

Referring to FIG. 3, a single picture element (pixel) structure in a field emission display is illustrated which overcomes the problem of such voltage transients. Field emission pixel structure 20 is positioned between a pair of support plates 22 and 24. Plate 22 is preferably glass or a transparent plastic and has deposited thereon a phosphor layer 26 and an anode electrode 28. Anode electrode 28 is, preferably, comprised of a transparent conductor material such as indium-tin-oxide. An anode potential Va is applied to anode electrode 28 via conductor 30.

Bottom substrate 24 may be any of a number of materials, but is preferably glass on which a conductive layer 32 is positioned. Conductive layer 32 is preferably grounded and supports a cold cathode electron emission material such as has been described above. In brief, it is an amorphous carbon matrix with cesium and dopant inclusions (e.g. phosphorous) to render it into a conductive state. A portion of cold cathode electron emitter 34 is formed into a conical emission tip 38 which has been subjected to an oxide processing procedure as described above. As a result, oxide layer 36 covers conical emission tip 38.

A control electrode 40 is positioned in electrical contact with non-oxidized portions of the surface of cold cathode electron emitter 34. Electrodes 26 and 40 are preferably arranged in the form of orthogonally oriented row and column conductors and, together, perform a pixel element selection function. A dielectric layer 42 encompasses conical emission tip 38 and further supports a gate electrode 44. A gate bias voltage Vg is connected via conductor 46 to gate electrode 44. Preferably, both anode bias Va and gate bias Vg are fixed during the operation of pixel element 20.

Electron emission from cold cathode electron emitter 34 is controlled by a control voltage Vc applied to electrode 40 via conductor 48. Anode bias voltage Va and gate bias voltage Vg are, together, insufficient to overcome the surface work function of conical emission tip 38 and to cause emission of an electron beam therefrom. Only when control voltage Vc is selectively applied does the potential difference between conical emission tip 38 and anode electrode 28 attain a sufficient level to enable an electron beam 50 to be emitted towards anode electrode 28. This is not to say that no electrons are emitted from conical emission tip 38 prior to the application of an appropriate control voltage Vc. However, only when an appropriate level of Vc is applied to conductor 40 is a sufficient density of electrons emitted to cause a visible level of light to be emitted from phosphor 26.

Figure 4:
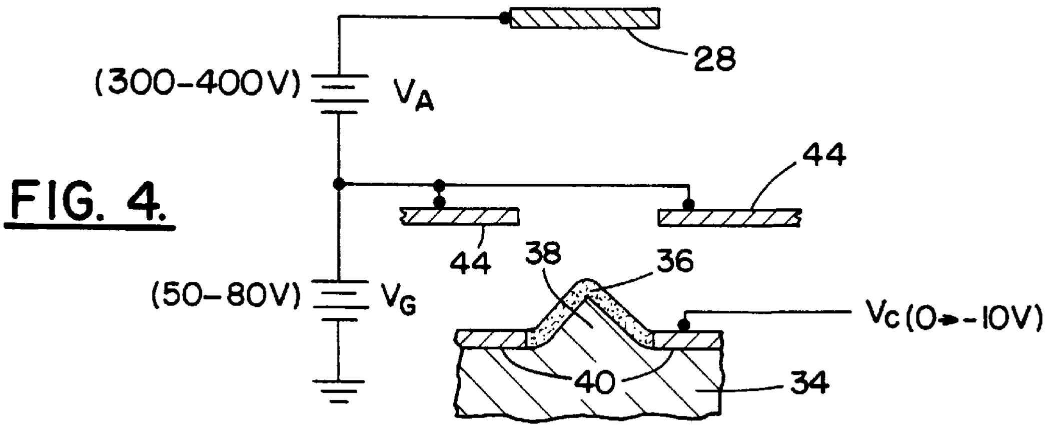
FIG. 4 is a schematic circuit diagram showing the interconnections used with the structure of FIG. 3.

Referring to FIG. 4, a circuit diagram illustrates exemplary values for anode potential Va, gate potential Vg and control voltage Vc. As is understood by those skilled in the art, the exact values of the applied voltages are dependent upon a number of factors and the aforesaid values are given for purposes of explanation only. The relative values of Va and Vg are adjusted such that the potential difference between conical emission tip 38 and anode conductor 28 is insufficient to enable the establishment of electron beam 50. Only when control voltage Vc is switched from 0 volts to −10 volts does the potential difference between conical emission tip 38 and anode 28 enable the establishment of electron beam 50. Thus, while the prior art has applied switching potentials to gate electrode 44 (thereby requiring a switching of 50 to 80 volts), by applying the switching potential to control electrode 40, while maintaining gate electrode 44 at a constant bias potential, much lower voltage swings are utilized to control a pixel element.

While not shown in the drawings, a processor is employed to enable appropriate selection of pixel element sites. Further, each pixel element site includes, preferably, three structures such as shown in FIG. 3 to enable three phosphors 26 to be utilized for full color presentations.

Figure 5:
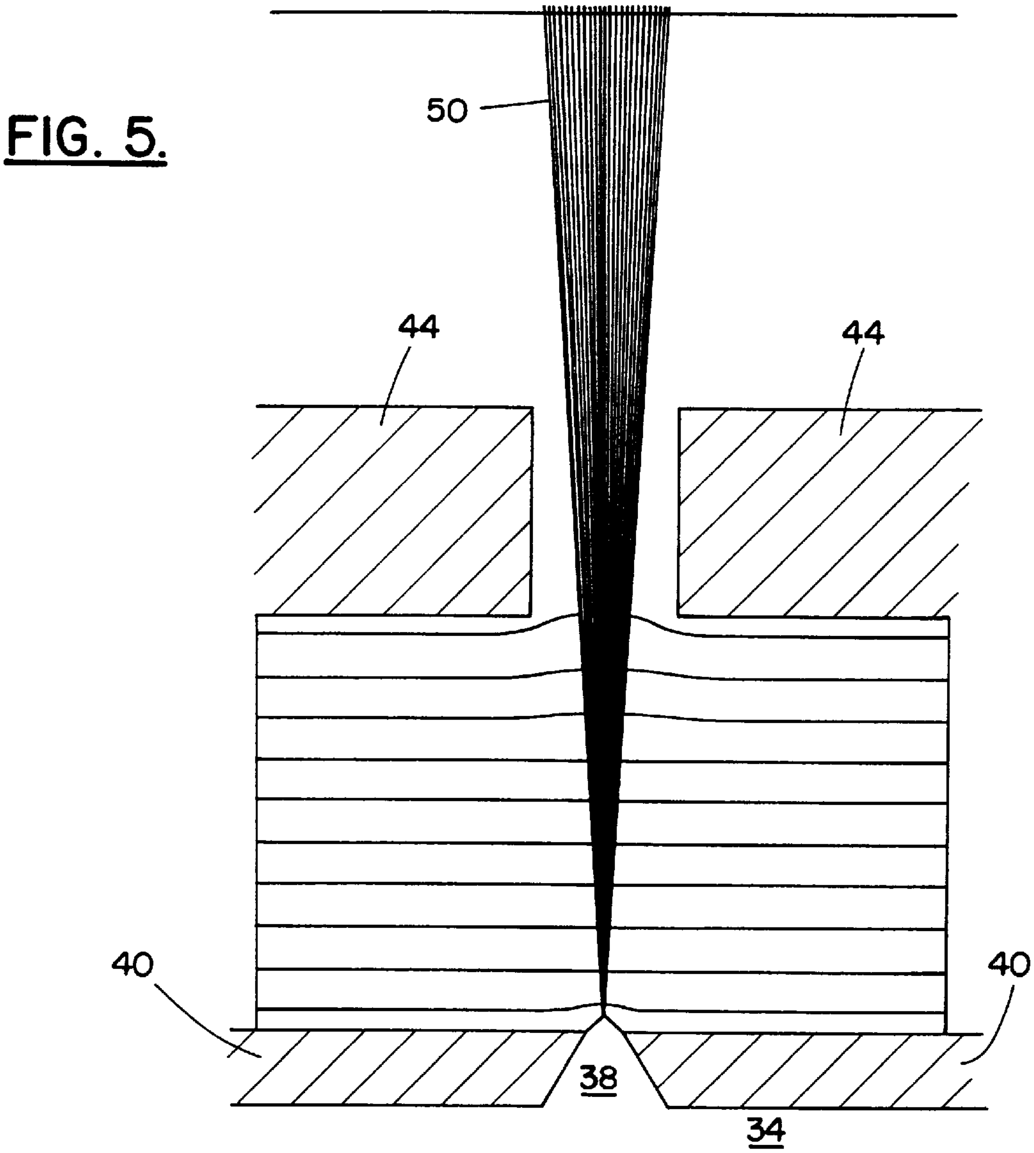
FIG. 5 is a diagram illustrating the configuration of an electron beam created by the structure of FIG. 3.
Figure 6:
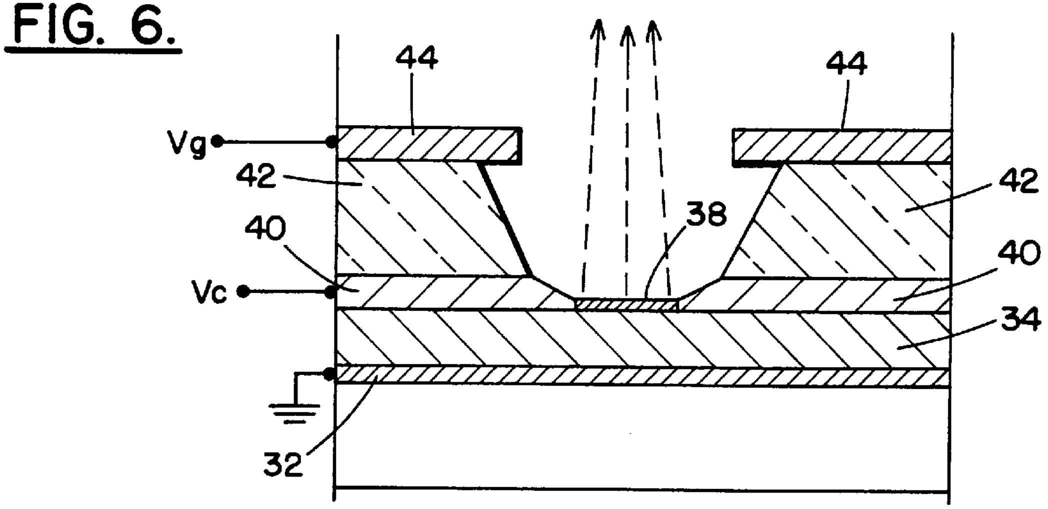
FIG. 6 illustrates a further embodiment of a cold cathode electron emission structure, incorporating the invention, which provides a more focused electron beam.
Figure 7:
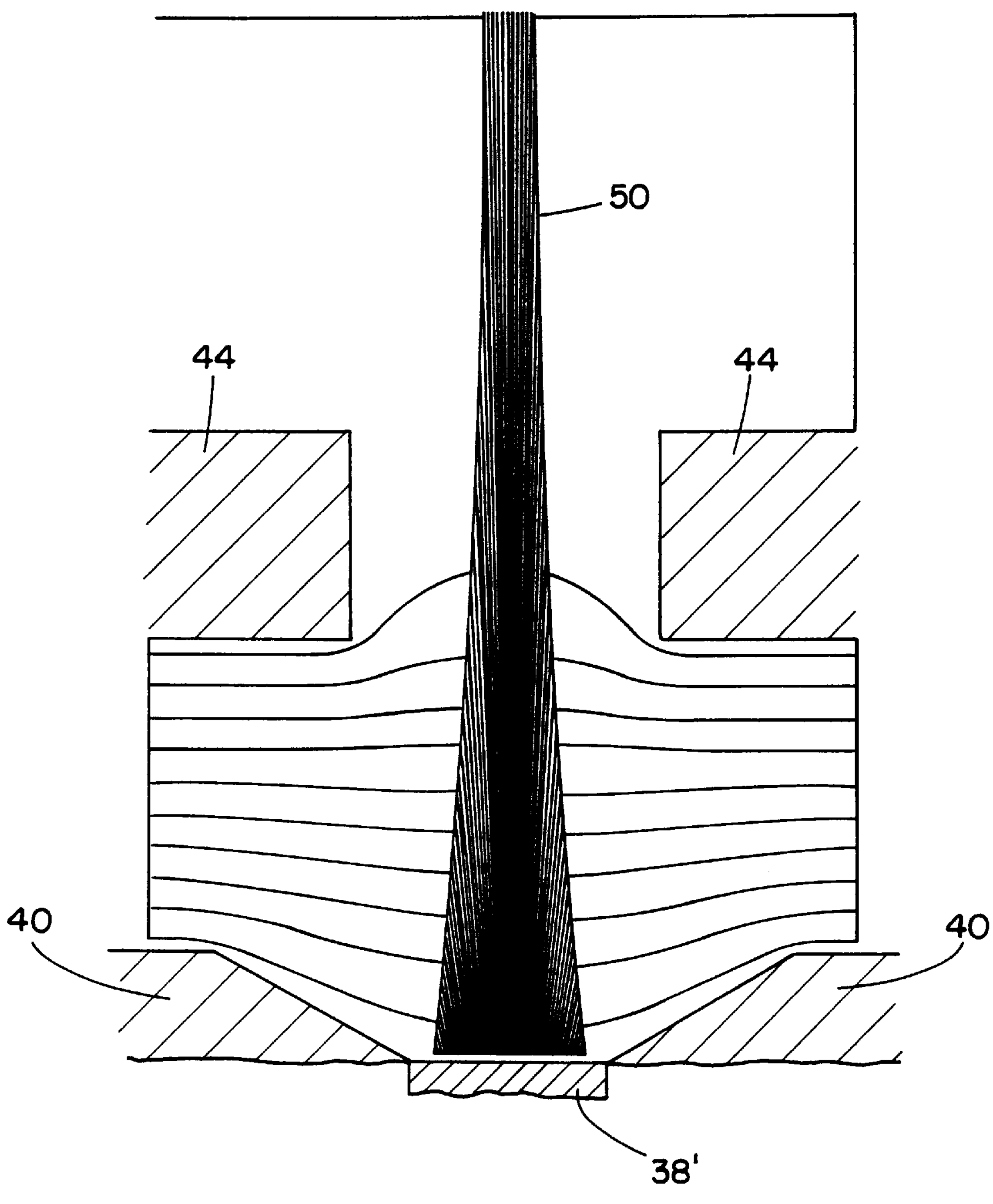
FIG. 7 is a diagram illustrating the configuration of the electron beam produced by the structure of FIG. 6.

Turning to FIG. 5, a field plot is shown which illustrates the electron dispersion which occurs in beam 50 when a conical emission tip 38 is utilized. However, if a planar emission structure 38' is employed, such as shown in FIG. 6, a more focused beam 50 results. Planar emission structure 38' is produced by initially depositing a cesium layer on the amorphous carbon/cesium/dopant emission structure and subsequently oxidizing the emission area 38'. Further, the edges of control conductors 40 are beveled to provide a potential well. The resulting field plot is illustrated in FIG. 7 and shows the beam focusing effect which occurs as a result of the planar emissions surface, in combination with the potential well created by beveled conductors 40. The result of the use of the cold cathode emission structure shown in FIGS. 6 and 7 is to create a more precisely focused electron beam than that which results from the use of a conical emission tip.

The emission structure of FIGS. 6 and 7 is particularly useful in a long focal length, field effect display wherein the phosphor is positioned a substantial distance from the emitter (on the order of 1–10 centimeters, as contrasted to microns in short focal length field effect displays). Such a long-focal length structure enables use of phosphors that have been developed for CRT applications. Currently, field effect displays employ low voltage phosphors which are degraded by non-moving images (e.g., a tool bar or other icon). A highly focused electron beam projected over a range of centimeters enables the use of phosphors developed for use with CRT technologies.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. A cold cathode electron emitter comprising:

an amorphous carbon matrix having cesium dispersed therein, said cesium present in substantially non-crystalline form; and a cesium-carbon-oxide layer on said amorphous carbon matrix and constituting an electron-emitting surface.

2. The cold cathode electron emitter as recited in claim 1, further comprising:

means for applying a control potential to said amorphous carbon matrix; and target means positioned to receive electrons from said electron emitting surface, said target means exhibiting a potential which, in combination with said control potential, causes electron emission from said electron emitting surface.

3. A display structure comprising:

electron emitter means having an electron-emitting surface, said electron emitter means comprising an amorphous carbon matrix having cesium dispersed therein, said cesium present in substantially non-crystalline form and a cesium-carbon-oxide layer on said amorphous carbon matrix to constitute said electron-emitting surface;

target electrode means having a target potential for attraction of electrons, and including a phosphor for emission of light when subjected to a beam of electrons;

gate electrode means positioned between said electron emitter means and said target electrode means and biased at a gate potential which attracts electrons from said electron emitter means but which, in combination with said target potential, is insufficient to cause emission of said beam of electrons from said electron emitting surface; and control electrode means coupled to said electron emitter means for selectively applying a control potential which, in combination with said gate potential and said target voltage, is sufficient to cause emission of said beam of electrons from said electron emitting surface.

4. The display structure as recited in claim 3, wherein said target potential is a voltage in a range of about 300 to 400 volts.

5. The display structure as recited in claim 4, wherein said gate potential is a voltage in a range of about 50 to about 80 volts.

6. The display structure as recited in claim 3, wherein said control electrode means applies either a negative control potential to said electron emitter means to cause said electron emission or a reference potential which is insufficient to cause said electron emission.

7. The display structure as recited in claim 3, wherein said electron-emitting surface takes a form of a substantially planar surface and said control electrode means surrounds said electron-emitting surface.

8. The display structure as recited in claim 3, wherein said control electrode means, at points which are adjacent to said electron-emitting surface, exhibits a beveled surface which tends to form electrons emerging from said electron emitting surface into a beam, said beam having a focal length in a range of about one to ten centimeters.

9. The display structure as recited in claim 3, wherein said electron-emitting surface takes a form of a conical surface and said control electrode means surrounds said electron-emitting surface.

10. A method for producing a cold cathode electron emitter comprising the steps of:

producing an amorphous carbon matrix having cesium dispersed therein, said cesium present in substantially non-crystalline form;

depositing a cesium layer on a surface of said amorphous carbon matrix by exposing said surface to a flux of cesium having a cesium content that is greater than $10^{12}$ atoms/cm$^2$sec; and exposing said cesium layer to oxygen at an elevated temperature to oxidize said cesium layer.

11. The method as recited in claim 10, wherein said exposing step occurs at a temperature in a range of about 250° C. to about 500° C.

12. The method as recited in claim 10, wherein said producing step causes said amorphous carbon matrix to further include a dopant which improves a conductivity characteristic thereof.

* * * * *